(12) United States Patent
Chiu et al.

(10) Patent No.: US 7,065,689 B2
(45) Date of Patent: Jun. 20, 2006

(54) DIAGONAL TESTING METHOD FOR FLASH MEMORIES

(75) Inventors: Sau-Kwo Chiu, Miau-Li Hsien (TW); Jen-Chieh Yeh, Tai-Chung (TW); Kuo-Liang Cheng, Shin-Ying (TW); Chih-Tsun Huang, Chia-Yi (TW); Cheng-Wen Wu, Hsinchu (TW)

(73) Assignees: Spirox Corporation/National, Hsinchu (TW); Tsing Hua University, Hsinchu (TW)

( * ) Notice: Subject to any disclaimer, the term of this patent is extended or adjusted under 35 U.S.C. 154(b) by 409 days.

(21) Appl. No.: 10/602,377

(22) Filed: Jun. 24, 2003

(65) Prior Publication Data

US 2004/0015756 A1    Jan. 22, 2004

(30) Foreign Application Priority Data

Jul. 9, 2002    (TW) ............................... 91115380 A

(51) Int. Cl.
G11C 29/00 (2006.01)
G11C 7/00 (2006.01)
G06F 12/16 (2006.01)

(52) U.S. Cl. ..................... 714/720; 711/103; 365/201
(58) Field of Classification Search ................ 714/720; 711/103; 365/201
See application file for complete search history.

(56) References Cited

U.S. PATENT DOCUMENTS 5,954,831 A * 9/1999 Chang ....................... 714/720

6,212,112 B1 * 4/2001 Naura et al. ................. 365/201
6,665,214 B1 * 12/2003 Cheah et al. .......... 365/185.22

OTHER PUBLICATIONS

"On comparing functional fault coverage and defect coverage formemory testing"Von-Kyoung et al. IEEE Transactions on Computer-Aided Design of Integrated Circuits and Systems, Publication Date: Nov. 1999 vol.: 18, Issue: 11On pp. 1676-1683.*
Yeh et. al, "Flash Memory Built-In Self Test Using March-Like Algorithms".
Mohammad et al., "Testing Flash Memories", (pp. 406-411), Jan. 2000.
Mohammad et al., "Flash Memory Disturbances: Modeling and Test" (pp. 1-9).

* cited by examiner

*Primary Examiner*—Guy Lamarre
*Assistant Examiner*—Cynthia Britt
(74) *Attorney, Agent, or Firm*—Seyfarth Shaw LLP

(57) ABSTRACT

The present invention discloses a diagonal testing method for flash memories. The testing method regards the flash memory as several squares, and executes in the direction from top to bottom and from left to right. Each square is provided with a first diagonal in −45 degrees from the upper left to the lower right, and a second diagonal in +45 degrees from the lower left to the upper right. The present invention is to program the cells in the first diagonal or the second diagonal, and then read the cells except the first diagonal or the second diagonal; or, program the cells except the first diagonal or the second diagonal, and then read the cells in the first diagonal or the second diagonal so as to detect the disturb fault in the flash memories and normal memory fault models.

20 Claims, 13 Drawing Sheets

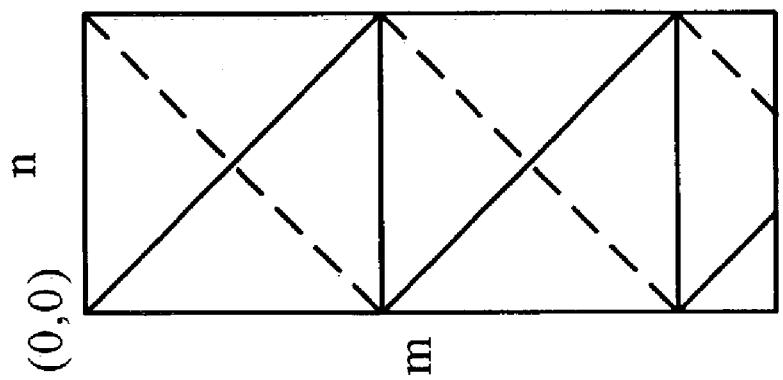
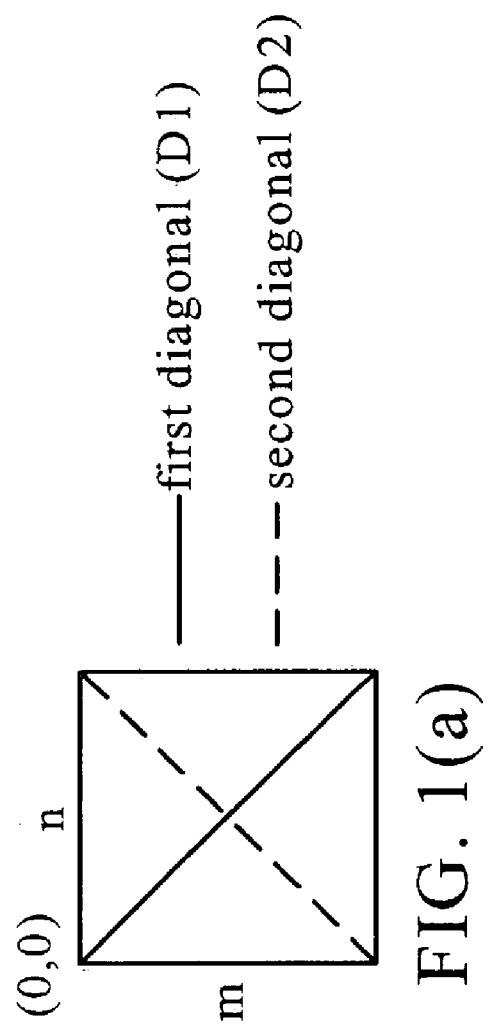
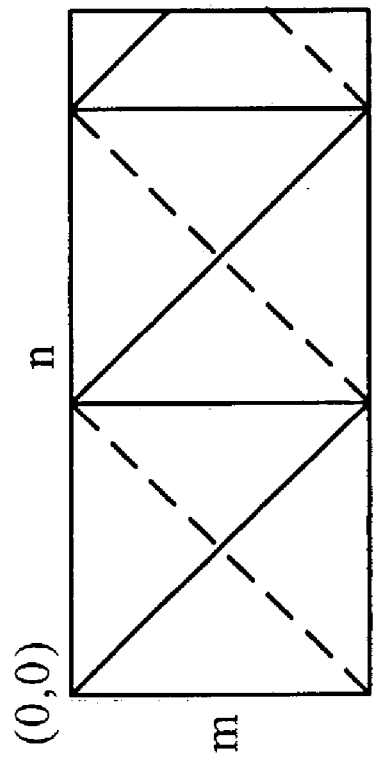
FIG. 1(a)
FIG. 1(b)
FIG. 1(c)

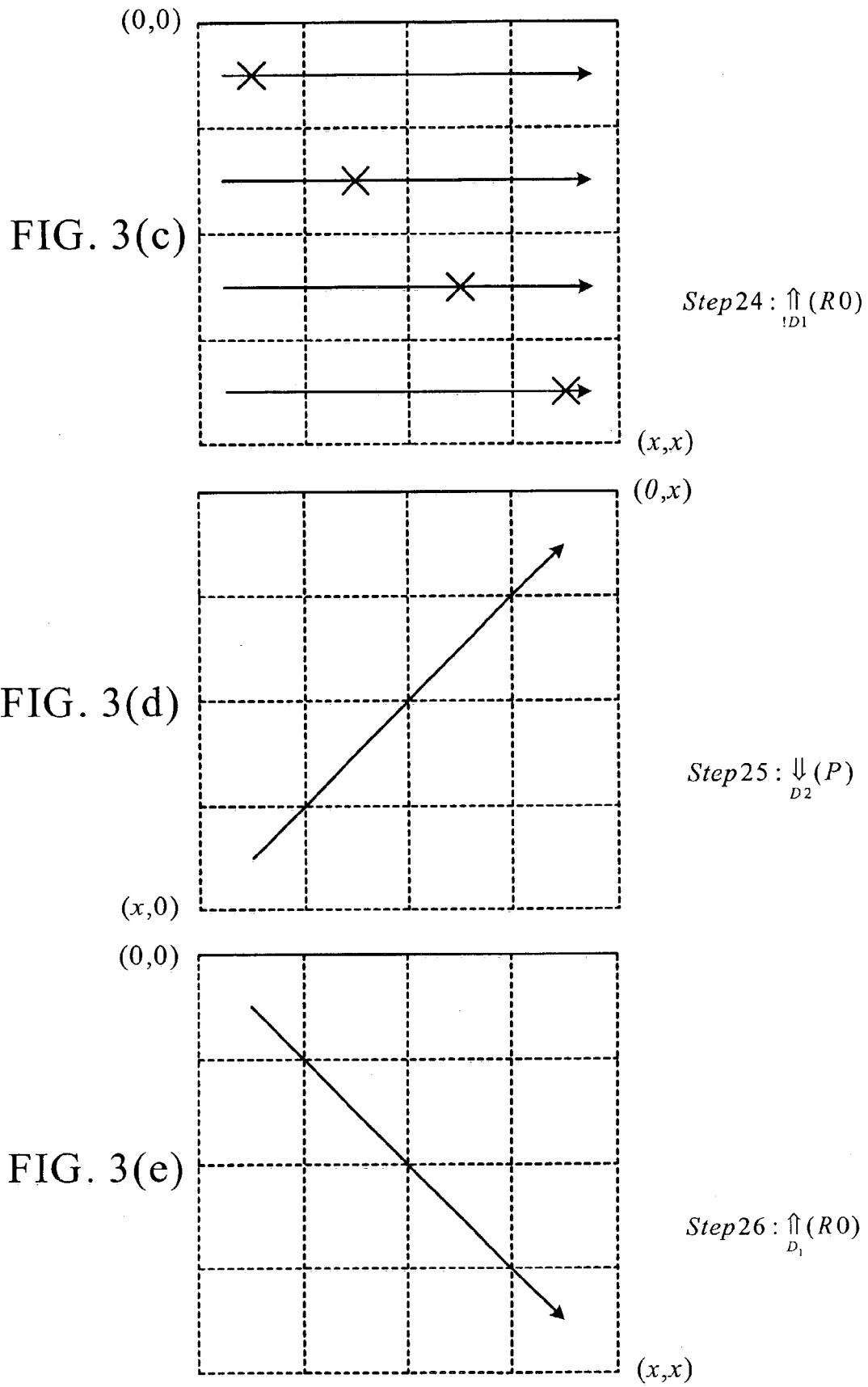

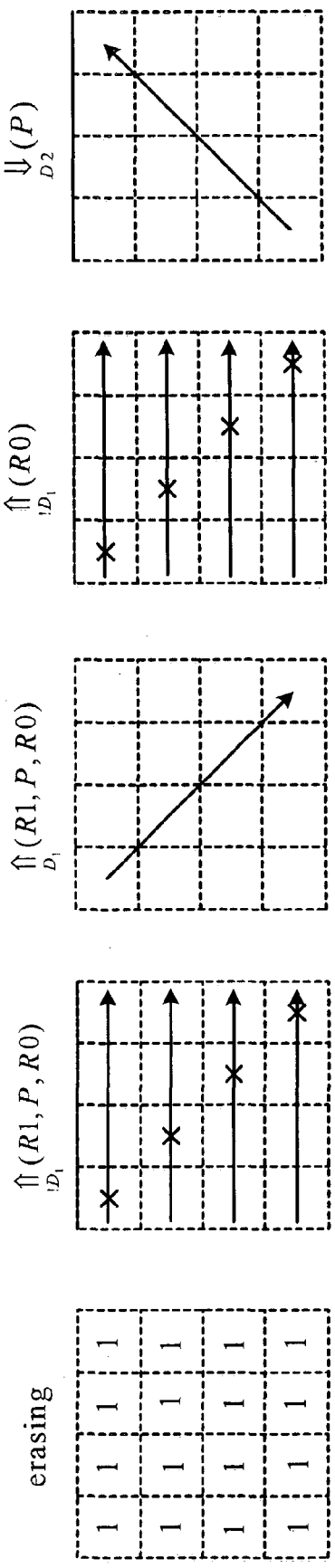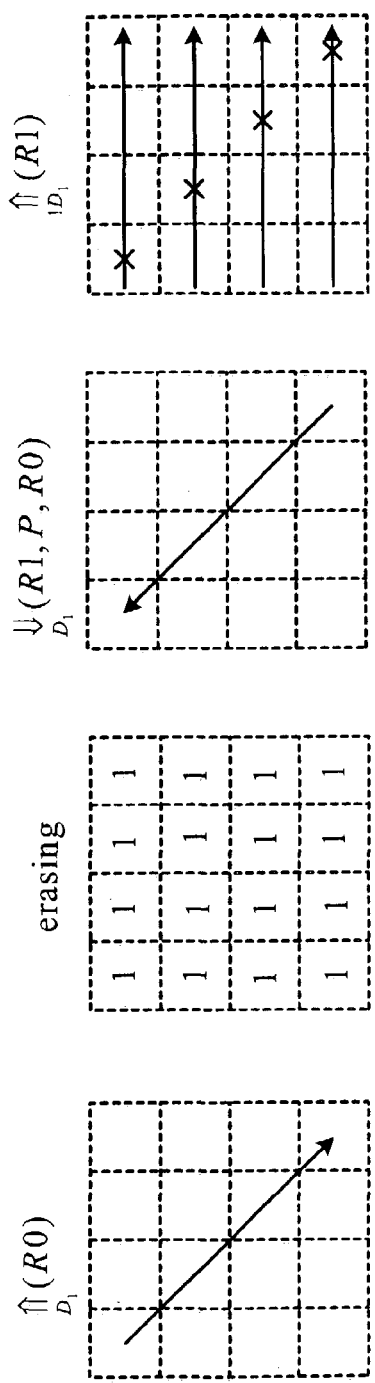
FIG. 4(a) FIG. 4(b) FIG. 4(c) FIG. 4(d) FIG. 4(e)
FIG. 4(f) FIG. 4(g) FIG. 4(h) FIG. 4(i)

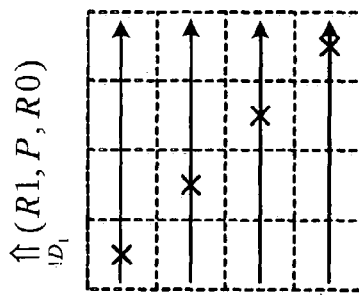
FIG. 5(e)
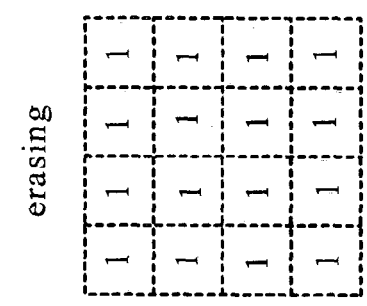
FIG. 5(d)
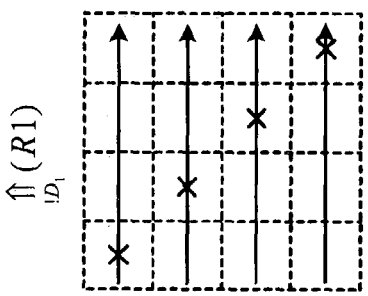
FIG. 5(c)
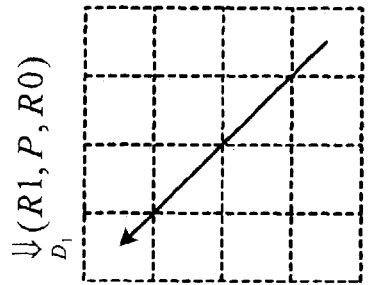
FIG. 5(b)
FIG. 5(a)
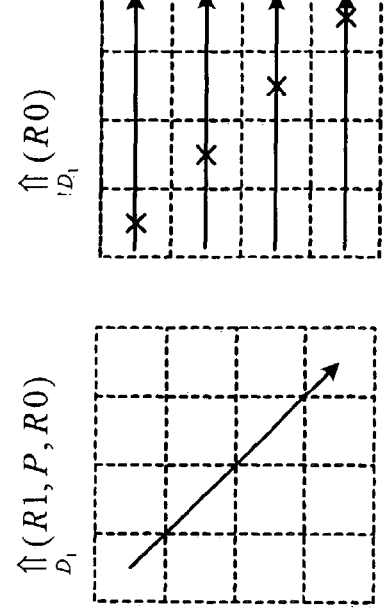
FIG. 5(i)
FIG. 5(h)
FIG. 5(g)
FIG. 5(f)

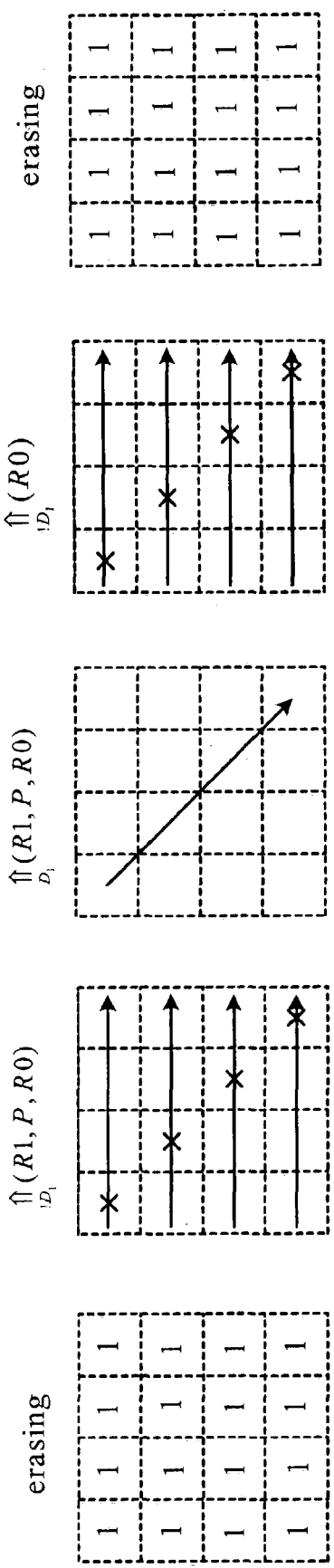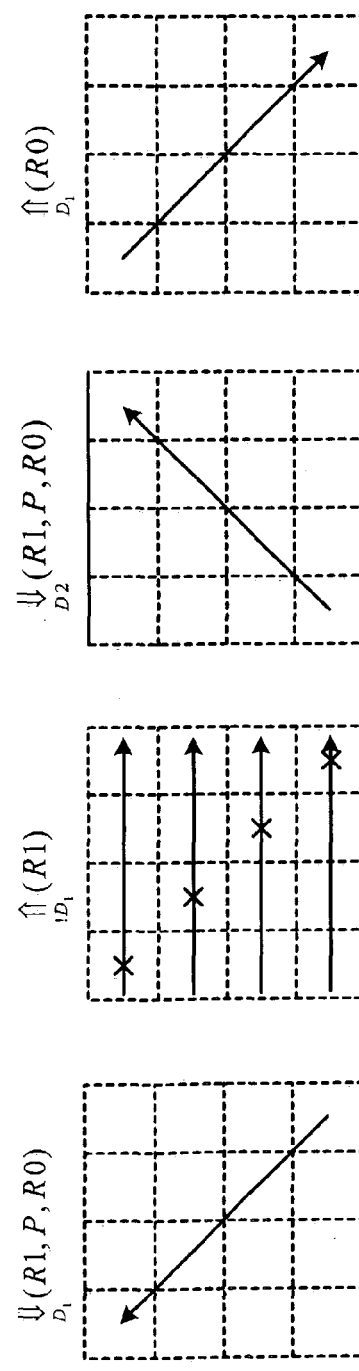

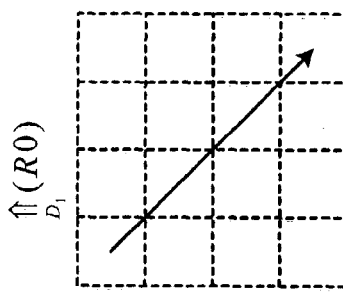
FIG. 7(e)
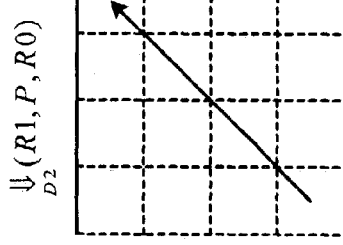
FIG. 7(d)
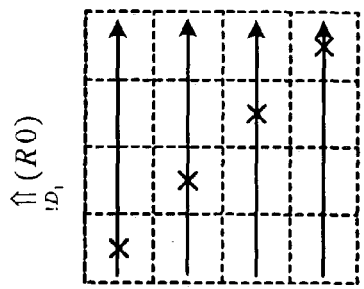
FIG. 7(i)
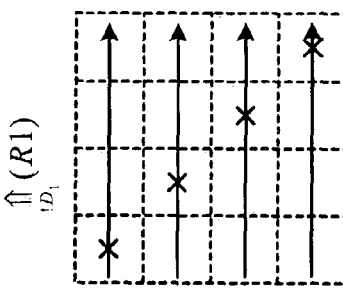
FIG. 7(c)
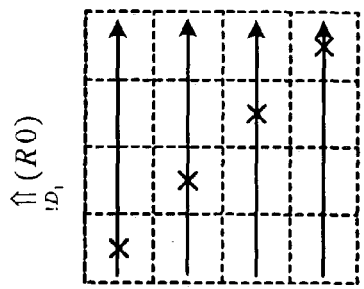
FIG. 7(h)
FIG. 7(b)
FIG. 7(g)
FIG. 7(a)
FIG. 7(f)

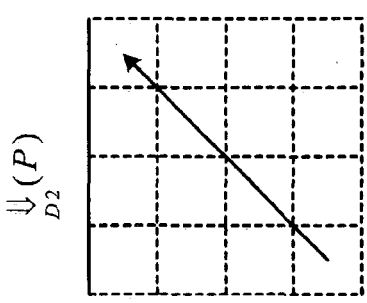
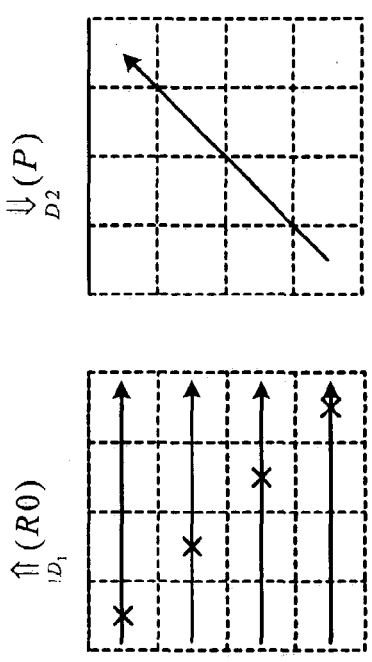
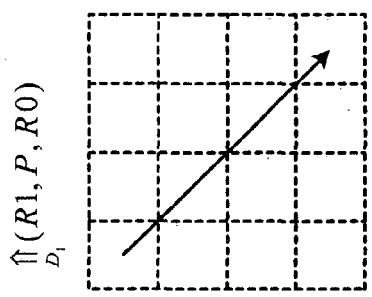
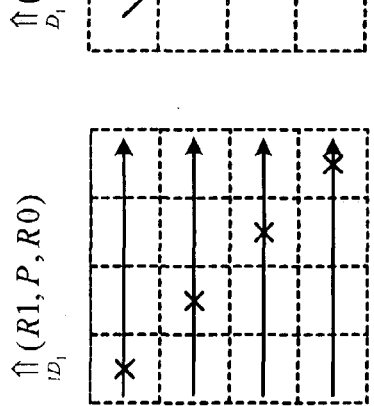
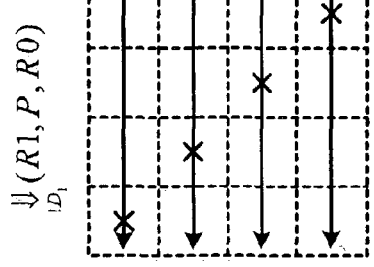
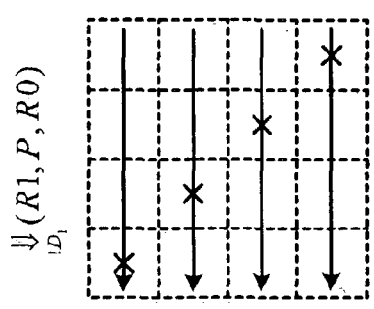
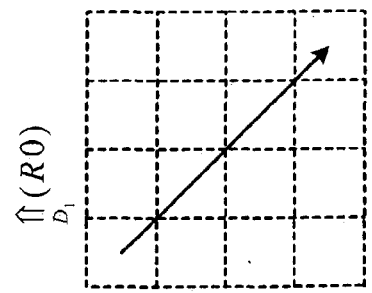

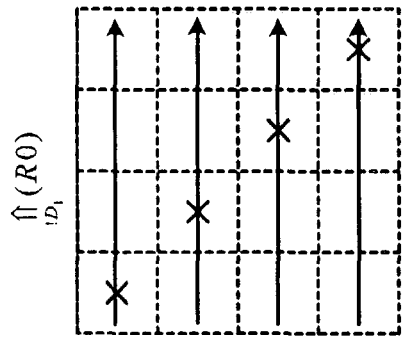
FIG. 9(a)  FIG. 9(b)  FIG. 9(c)  FIG. 9(d)
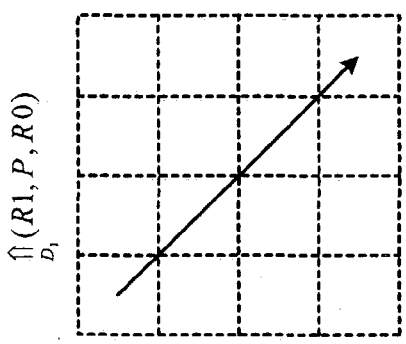
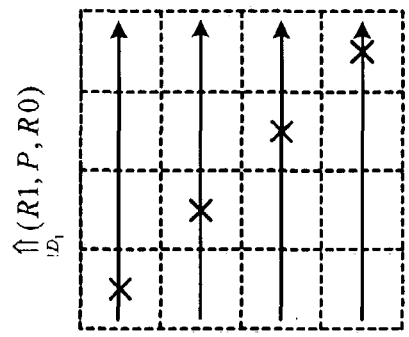
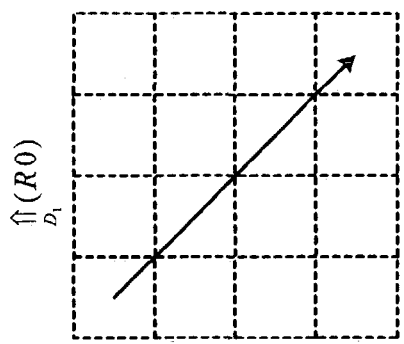
FIG. 9(e)  FIG. 9(f)  FIG. 9(g)  FIG. 9(h)
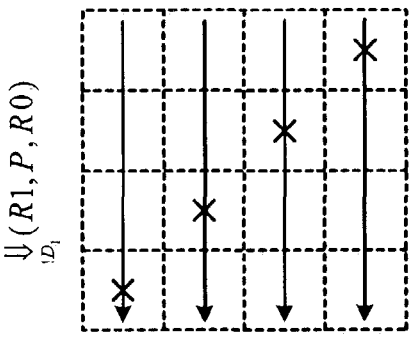
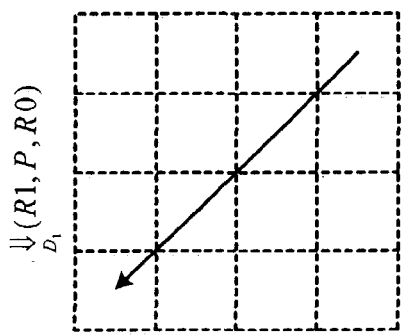

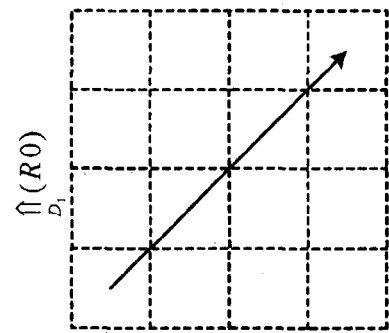
FIG. 10(d)
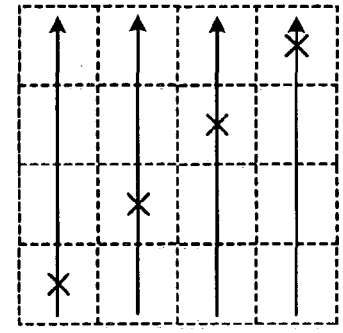
FIG. 10(h)
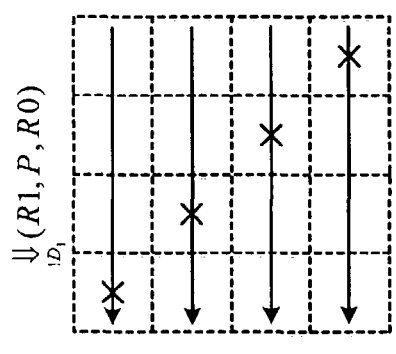
FIG. 10(c)
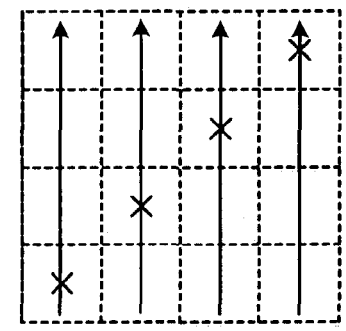
FIG. 10(g)
FIG. 10(b)
FIG. 10(f)
FIG. 10(a)
FIG. 10(e)

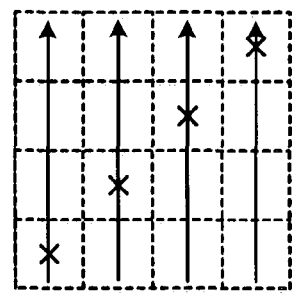
FIG. 11(e)
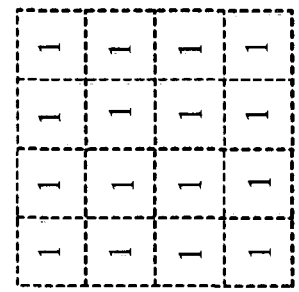
FIG. 11(d)
FIG. 11(i)
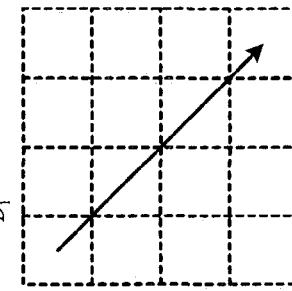
FIG. 11(c)
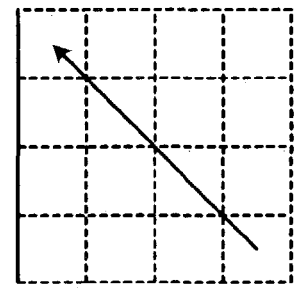
FIG. 11(h)
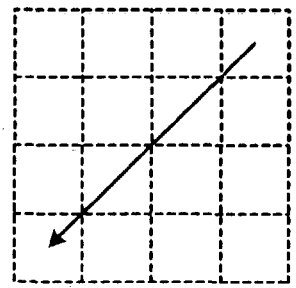
FIG. 11(b)
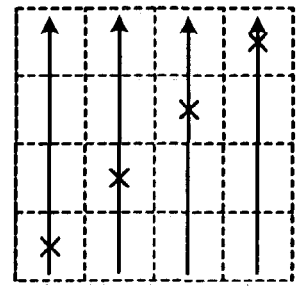
FIG. 11(g)
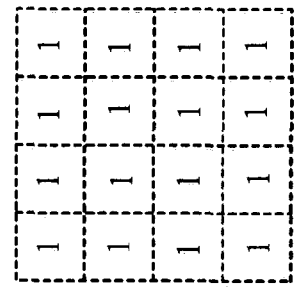
FIG. 11(a)
FIG. 11(f)

DIAGONAL TESTING METHOD FOR FLASH MEMORIES

BACKGROUND OF THE INVENTION

1. Field of the Invention

The present invention relates to a testing method for flash memories, particularly to a diagonal testing method for flash memories.

2. Background of the Invention

The flash memory is a type of programmable and erasable non-volatile memory for recording data. Recently, the requirement for flash memories has been growing rapidly, especially in the application of wireless transmission, automatic equipment, data storage, set-top box and all kinds of multi-media products. The flash memory also has been largely integrated into the SOC (system on a chip) comprising all kinds of logic circuits and memory cores, particularly in the portable product with battery as its power supply. Because the design for SOC tends to have high density, high capacity and high pins, the test time and difficulties are significantly increased. Thus, it becomes an important issue to rapidly and effectively reduce the test time to increase the yield.

Generally, the testing or diagnosis for flash memories is more difficult than conventional memories, particularly due to the disturbance problem during reading and writing cells on the same row or same column. It regulates the disturbance problem and the influence for flash memories in the IEEE 1005 standard. For example, the adjacent memory cells will have undesired charge transfer during the reading or programming of the memory cell in high voltage operation. Compared with the operation of SRAM or DRAM, the flash memory is different in not only writing a single bit or word, but on the contrary, that it can proceed the flash erase on the entire block or chip, such as writing the entire block or chip with logic 1 simultaneously.

Recently, there are different testing methods developed continuously. In which, disturb faults and an optimum algorithm (hereinafter referred to "EF") are disclosed in M. G. Mohammad, K. K. Saluja, and A. Yap, "Testing Flash Memories," in Proc. 13th Int. Conf. VLSI Design, January 2000, pp. 406–411. In a paper proposed by M. G. Mohammad and K. K. Saluja, "Flash Memory Disturbances: Modeling and Test," Proc. IEEE VLSI Test Symp., Marina Del Ray, Calif., April 2001, pp. 218–224, it divides the disturb fault model for flash memories into several coupling faults, and proposes an effective March-like algorithm (hereinafter referred to Flash March) for detecting the coupling faults. In a paper proposed by J. C. Yen, C. F. Wu, K. L. Cheng, Y. F. Chou, C. T. Huang, and C. W. Wu, "Flash Memory Built-in Self-test Using March-Like Algorithms", Proc. IEEE Int. Workshop on Electronic Design, Test, and Applications (DELTA), Christchurch, January 2002, pp. 137–141, a bit-oriented and word-oriented March-like algorithm (hereinafter referred to March-FT) is disclosed, and is used to cover all the disturb fault types defined in IEEE 1005 standard.

For the operation of the flash memory, the operational speed for erasing is the slowest, the speed for programming is faster, and the speed for reading is the fastest. However, the conventional March-like algorithm includes many writing operations (including erasing and programming), and the test time is too long to make the testing cost relatively high. Therefore, how to design an effective testing method for effectively reducing the required test time without reducing the fault coverage becomes a very important issue.

SUMMARY OF THE INVENTION

The main object of the present invention is to provide a diagonal testing method for flash memories that can effectively reduce the required test time without reducing the fault coverage.

The second object of the present invention is to provide a testing method for flash memories that cannot only be applied in the production of testing software, but also be applied in the production of built-in self-testing circuit.

To this end, the diagonal testing method for flash memories according to the present invention includes steps (a) to (e). In step (a), the entire flash memory cell array is erased. In step (b), the cells except the first diagonal are programmed. In step (c), the cells in the first diagonal are read. In step (d), the cells in the first diagonal are programmed. In step (e), the cells except the first diagonal are read.

The diagonal testing method for flash memories according to the present invention further includes steps (f) and (g). In step (f), the cells in the second diagonal are programmed. In step (g), the cells in the first diagonal are read. Steps (f) and (g) and steps (a) to (e) need not have the sequential relations during executing. The developer for the testing program can decide whether steps (f) and (g) or steps (a) to (e) are executed first according to the convenience for developing program.

The diagonal testing method for flash memories according to the present invention further includes steps (h) to (j). In step (h), the flash memory cell array is erased. In step (i), the cells in the first diagonal of the flash memory cell array are programmed in the direction opposite to the first diagonal. In step (j), the cells in the flash memory cell array except the first diagonal are read. Steps (h) to (j), steps (a) to (e) or steps (f) and (g) need not have the sequential relations during executing. The developer for the testing program can decide whether steps (h) to (j), steps (f) and (g), or steps (a) to (e) are executed first according to the convenience for developing program.

In step (j) according to the present invention, an extended algorithm can be used to make the fault coverage up to 100%. But, when the extended algorithm is used, step (f) can be omitted.

In the above-mentioned method, the flash memory can be regarded as several squares, and executed in the direction from top to down and from left to right. Each square is provided with a first diagonal in −45 degrees from the upper left to the lower right, and a second diagonal in +45 degrees from the lower left to the upper right. The present invention is to program the cells in the first diagonal or the second diagonal, and then read the cells except the first diagonal or the second diagonal; or, program the cells except the first diagonal or the second diagonal, and then read the cells in the first diagonal or the second diagonal so as to detect the disturb fault in the flash memories and normal memory fault models.

The above-mentioned −45 and +45 degrees in the execution direction for the first diagonal and the second diagonal respectively are only one embodiment of the present invention. The designer can modify the degrees based on his own preference in the practical application, and the execution direction of the present invention is not limited to a specific direction, such as the first diagonal or the second diagonal.

The fault detecting range in the present invention covers not only the disturb faults in the flash memories, but also the conventional memory faults.

The circuit area formed by the above-mentioned testing method is relatively small, which is about 2,000 to 3,000 gate counts for a common flash memory. The testing method according to the present invention can reduce the test time to about 42.69% as the conventional March-like algorithm.

Thus, the testing method according to the present invention can effectively reduce the required test time without reducing the fault coverage, which obviously presents the innovation and the progress.

BRIEF DESCRIPTION OF THE DRAWINGS

The present invention will be described according to the appended drawings in which:

FIGS. 1(a) to 1(c) are hint diagrams of the diagonal divisions of the flash memory according to the present invention;

FIGS. 3(a) to 3(g) are exploded diagrams of the first embodiment according to the present invention;

FIGS. 4(a) to 4(i) are other exploded diagrams of the first embodiment according to the present invention;

FIGS. 5(a) to 5(i) are exploded diagrams of the second embodiment according to the present invention;

FIGS. 6(a) to 6(i) are exploded diagrams of the third embodiment according to the present invention;

FIGS. 7(a) to 7(i) are exploded diagrams of the fourth embodiment according to the present invention;

FIGS. 8(a) to 8(i) are exploded diagrams of the fifth embodiment according to the present invention;

FIGS. 9(a) to 9(h) are exploded diagrams of the sixth embodiment according to the present invention;

FIGS. 10(a) to 10(h) are exploded diagrams of the seventh embodiment according to the present invention; and FIGS. 11(a) to 11(i) are exploded diagrams of the eighth embodiment according to the present invention.

DESCRIPTION OF THE PREFERRED EMBODIMENTS

Figure 2:
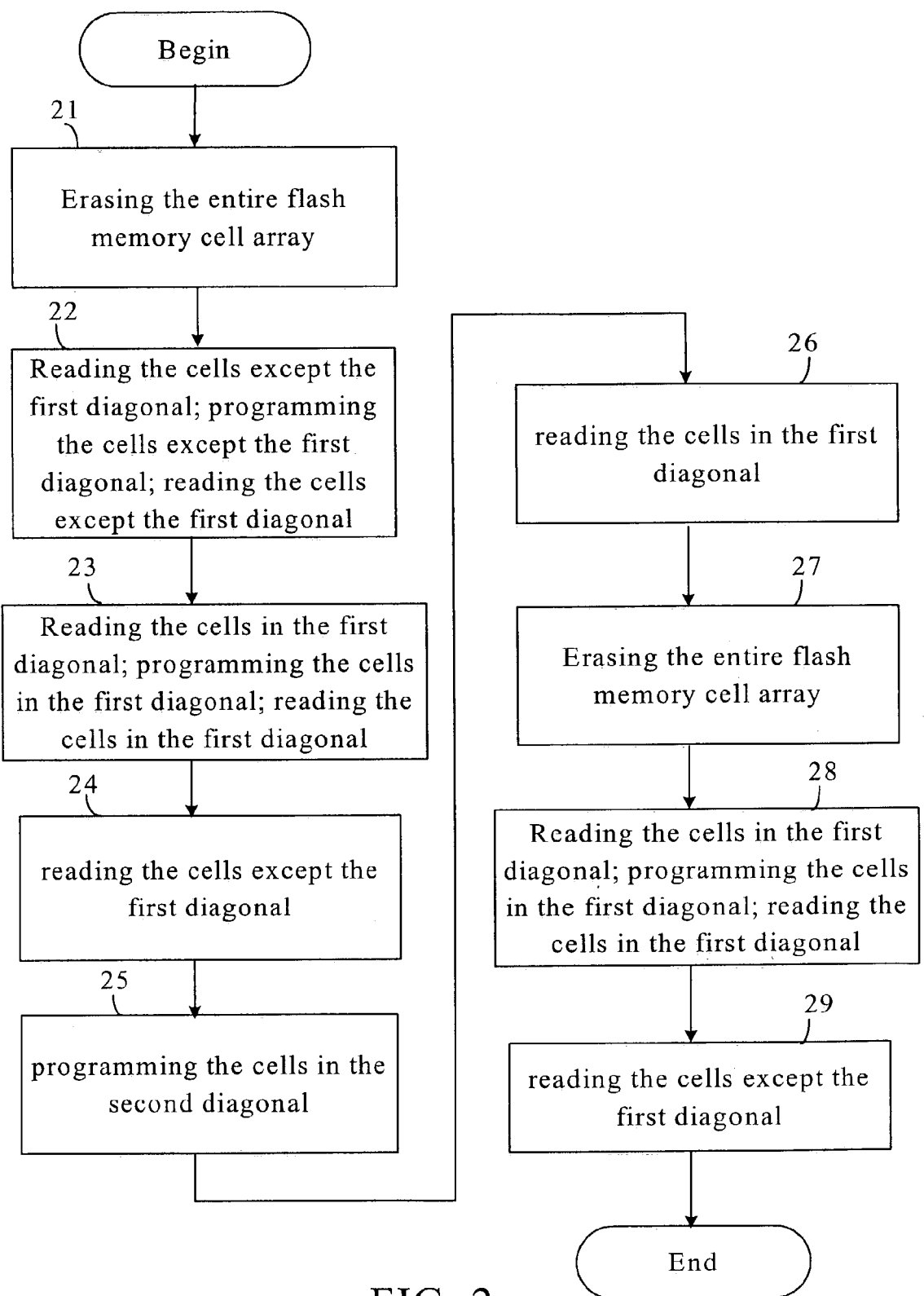
FIG. 2 is a testing flow chart of the first embodiment according to the present invention.

The diagonal testing method for flash memories according to the present invention is mainly to eliminate the disturb faults in the flash memory and the fault models appearing in the common memory. Because a high voltage is applied to the terminals of the floating gate of the flash memory, the disturbance problem is likely to happen, and the cells influenced by the disturbance effect are usually located on the same bit-line or the same word-line as the programmed or read cells. Generally, the disturb fault model can be divided into:

1. Word-line Program Disturbance (WPD). The reason for this disturbance is that after programming with a cell, the unprogrammed cells on the same word-line are also programmed.
2. Word-line Erase Disturbance (WED). The reason for this disturbance is that after programming with a cell, the programmed cells on the same word-line are erased.
3. Bit-line Program Disturbance (BPD). The reason for this disturbance is that after programming with a cell, the unprogrammed cells on the same bit-line are also programmed.
4. Bit-line Erase Disturbance (BED). The reason for this disturbance is that after programming with a cell, the programmed cells on the same bit-line are erased.
5. Read Disturbance (RD). The reason for this disturbance is that after repeatedly reading a cell, the current leakage for the floating gate cannot be retained at the status of logic zero.
6. Over Erase (OE). The reason for this disturbance is that if a cell is repeatedly erased, such as after erasing, the threshold voltage is too low to convert the cell into a depletion transistor.

A normal fault model for the memory includes the followings:
1. Stuck-At Fault (SAF)
2. Transition Fault (TF)
3. Stuck-Open Fault (SOF)
4. Address decoder Fault (AF)
5. State-Coupling Fault (SFst)

The algorithm according to the present invention is based on the reading and writing operations for the two diagonals in the flash memory cell array. The first diagonal, as the solid lines in the FIGS. 1(a) to 1(c), is a −45° line from the upper left to the lower right. The second diagonal, as the dashed lines in FIGS. 1(a) to 1(c), is a +45° line from the lower left to the upper right, wherein m represents the number of rows, and n represents the number of columns, and the lowest address is located at the upper left. The algorithm according to the present invention can be applied to the flash memory cell array with different numbers of rows and column. For example, FIG. 1(a) represents the case that the number of rows is equal to the number of columns in the flash memory cell array, FIG. 1(b) represents the case that the number of rows is less than the number of columns, and FIG. 1(c) represents the case that the number of rows is larger than the number of columns. As shown in FIG. 1(b) and FIG. 1(c), the testing method is to assume that the flash memory is composed of cells of several squares, and executed in the direction from top to bottom and from left to right. For convenient description, the following embodiments having the flash memory cell array with the number of rows less than and equal to the number of columns are described.

FIG. 2 is a testing flow chart of the first embodiment according to the present invention, which includes the following steps, and the diagrams for each step are shown from FIGS. 3(a) to 3(g):

STEP 21: Erasing the entire flash memory cell array, so that the values of entire flash memory cell array are set as logic one.

Figure 3A:
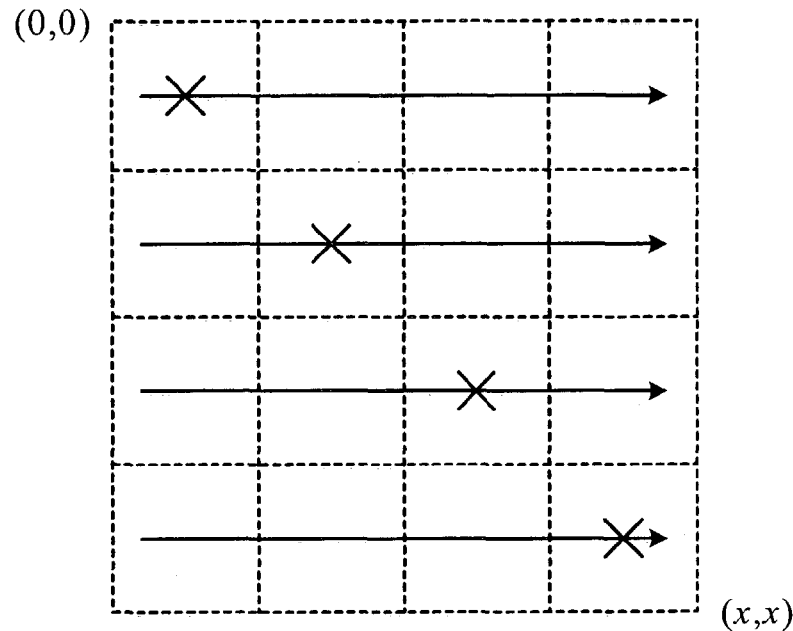

STEP 22: As shown in FIG. 3(a), which can be divided into three sub-steps:
  I. Reading the cells except the first diagonal. If the values thereof are not logic one, it means the SOF and CFst faults exist.
  II. Programming the cells except the first diagonal, for detecting the cells in the first diagonal if occurred with WPD and BPD faults.
  III. Reading the cells except the first diagonal. If the values thereof are not logic zero, it means the OE fault exists.

Figure 3B:
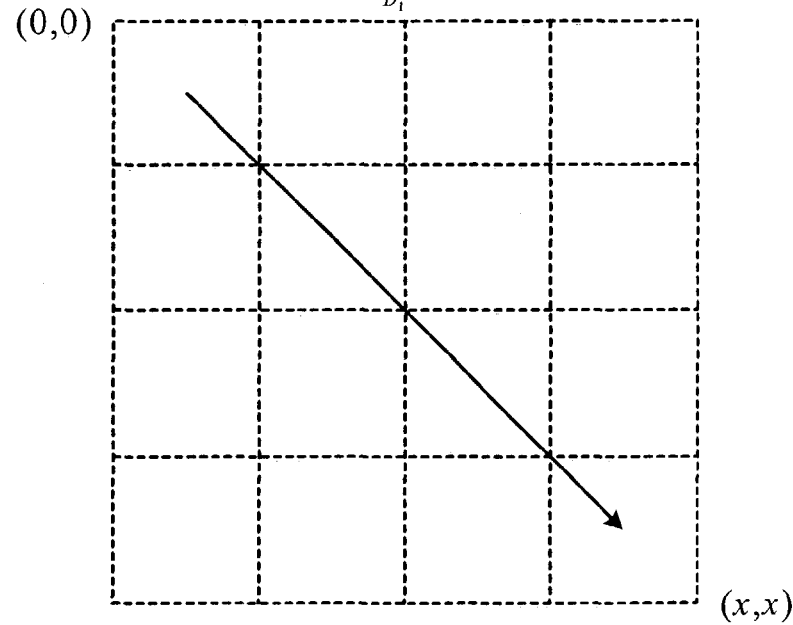

STEP 23: As shown in FIG. 3(b), which can be divided into three sub-steps:
  I. Reading the cells in the first diagonal. If the values thereof are not logic one, it means the WPD and BPD faults exist.
  II. Programming the cells in the first diagonal, for detecting the cells except the first diagonal if occurred with the WED and BED faults.
  III. Reading the cells in the first diagonal. If the values thereof are not logic zero, it means the OE fault exists.

STEP 24: As shown in FIG. 3(c), reading the cells except the first diagonal. If the values thereof are not logic zero, it means the WED and BED faults exist.

STEP 25: As shown in FIG. 3(d), programming the cells in the second diagonal, for detecting the cells in the first diagonal if occurred with the WED and BED faults.

STEP 26: As shown in FIG. 3(e), reading the cells in the first diagonal. If the values are not logic zero, it means the WED and BED faults exist.

STEP 27: Erasing the entire flash memory cell array, for setting the entire flash memory cell array as logic one.

Figure 3F:
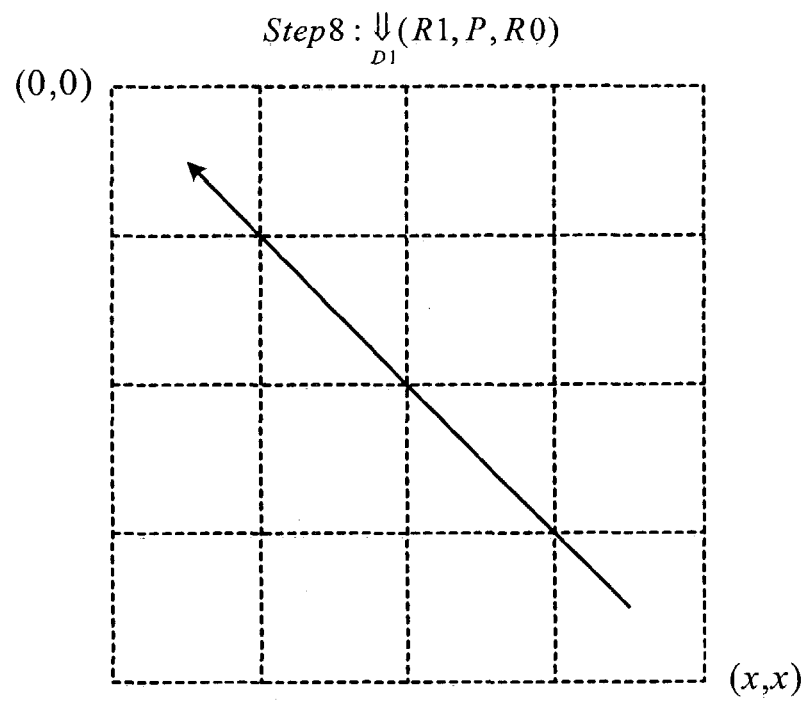

STEP 28: As shown in FIG. 3(f), which can be divided into three sub-steps:
  I. Reading the cells in the first diagonal in the direction opposite to the first diagonal for detecting more common memory faults. If the values thereof are not logic one, it means the SOF and CFst faults exist.
  II. Programming the cells in the first diagonal in the direction opposite to the first diagonal for detecting the cells except the first diagonal if occurred with the WPD and BPD faults.
  III. Reading the cells in the first diagonal in the direction opposite to the first diagonal for detecting more common memory faults. If the values thereof are not logic zero, it means the CFst faults exist.

Figure 3G:
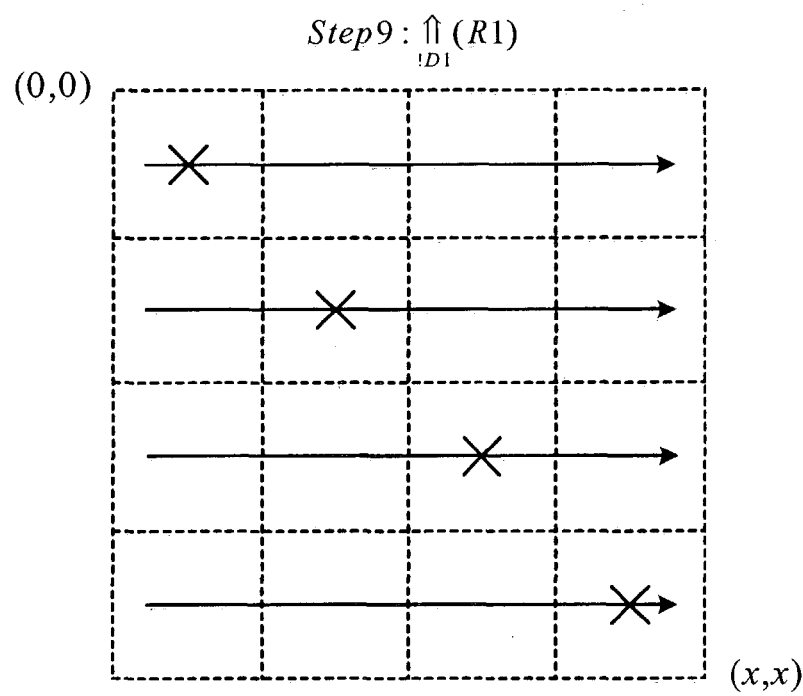

STEP 29: As shown in FIG. 3(g), reading the cells except the first diagonal. If the values thereof are not logic one, it means the WPD and BPD faults exist.

One embodiment of the algorithm according to the testing method of the present invention is shown as follow:

```
1. Flash Erase;
   // let i represents the row address index of the flash memory cell
   array, j represents the column address index of the flash memory cell
   array, and x represents the minimum between m and n
2. for j=0 to (n−1)       // except the cells in the first diagonal
      for i=0 to (m−1)
          if((j−i) % m)!=0)
             {   Read1 (i,j);
                 Program (i,j);
                 Read0 (i,j);}
3. for j=0 to (n−1)       // the cells in the first diagonal
      for i=0 to (m−1)
          if(((j−i) % m)=0)
             {Read1 (i,j);
                 Program (i,j);
                 Read0 (i,j);}
4. for j=0 to (n−1)       // except the cells in the first diagonal
      for i=0 to (m−1)
          if(((j−i) % m)!=0)      Read0 (i,j);
5. for j=0 to (n−1)       // the cells in the second diagonal
      for i=(m−1) to 0
          if(((j−(m−1)−i)) % m)=0)      Program (i,j);
6. for j=0 to (n−1)       // the cells in the first diagonal
      for i=0 to (m−1)
          if(((j−i) % m)=0)      Read0 (i,j);
7. Flash Erase;
8. for j=(n−1) to 0       // the cells in the first diagonal
      for i=(m−1) to 0
          if(((j−1) % m)=0)
             {   Read1 (i,j);
                 Program (i,j);
                 Read0 (i,j);       }
9. for j=0 to (n−1)       // except the cells in the first diagonal
      for i=0 to (m−1)
          if(((j−i) % m)!=0) Read1 (i,j);
```

The algorithm of the present invention can be represented as the following simple form:

$$\left\{(E); \underset{!D_1}{\Uparrow}(R1,P,R0); \underset{D_1}{\Uparrow}(R1,P,R0); \underset{!D_1}{\Uparrow}(R0); \underset{D_2}{\Downarrow}(P); \underset{D_1}{\Uparrow}(R0);\right.$$
$$\left.(E); \underset{D_1}{\Downarrow}(R1,P,R0); \underset{!D_1}{\Uparrow}(R1)\right\}$$

wherein the symbol ⇑ represents an ascending address sequence, the symbol ⇓ represents a descending address sequence, $D_1$ represents the cells in the first diagonal, $D_2$ represents the cells in the second diagonal, $!D_1$ represents except the cells in the first diagonal, $!D_2$ represents except the cells in the second diagonal, R1 represents to read cells, and if the value is not logic one, an error will be detected; P represents to program cells; R0 represents to read cells, and if the value is not logic zero, an error will be detected.

It should be noted that, the fault model and the algorithm in the above-mentioned embodiments are illustrated with the NOR gate type of flash memories, but there is no specific limit in the practical application. Moreover, for the RD fault, the operating voltages for reading a cell are equal to those of the effected cells of the WED fault, and therefore, the RD fault will be activated and detected as a WED fault.

The algorithm for the above-mentioned embodiment according to the present invention cannot reach 100% for the fault coverage on the AF and CFst faults. An available method as follows can be used to modify the step 29:

STEP 29: As shown in FIG. 3(b), which can be divided into three sub-steps:
  I. Reading the cells except the first diagonal in the direction from the higher address to the lower address. If the values thereof are not logic one, it means the SOF and CFst faults exist.
  II. Programming the cells except the first diagonal in the direction from the higher address to the lower address.
  III. Reading the cells except the first diagonal in the direction from the higher address to the lower address. If the values thereof are not logic zero, it means the OE fault exists.

An embodiment of the algorithm according to amended step 29 is as follows:

```
10. for j=(n−1) to 0       // (R1,P,R0) all cells
       for i=(m−1) to 0    // except the cells in the first diagonal
           if(((j−i) % m)!=0)
              {    Read1 (i,j);
                   Program (i,j);
                   Read0 (i,j);}
```

The algorithm of the present invention can be represented as the following simple form:

$$\left\{(E); \underset{!D_1}{\Uparrow}(R1,P,R0); \underset{D_1}{\Uparrow}(R1,P,R0); \underset{!D_1}{\Uparrow}(R0); \underset{D_2}{\Downarrow}(P); \underset{D_1}{\Uparrow}(R0);\right.$$
$$\left.(E); \underset{D_1}{\Downarrow}(R1,P,R0); \underset{!D_1}{\Downarrow}(R1,P,R0)\right\}$$

The test time for the modified algorithm (hereinafter referred to an extended diagonal type) is slightly increased, and the testing length becomes 2e+(2mn+max(m, n))p+5mnr, where the parameter e represents the erasing time, the parameter p represents the programming time, and the parameter r represents the reading time. For a 2 MB flash memory, the test time is about 6.711 seconds, which is almost equal to the March-like algorithm. However, if it only considers the fault detection of the disturb fault model in the flash memory, the algorithm of the first embodiment according to the present invention is preferred. Because it is provided with shorter test time, the testing cost can be greatly reduced.

FIGS. 4(a) to 4(i) are other exploded diagrams of the first embodiment (hereinafter referred to the diagonal type) according to the present invention. It should be noted that, the steps in FIGS. 4(g) to 4(i) are more independent flows relative to the steps in FIGS. 4(a) to 4(f), so that the steps in FIGS. 4(g) to 4(i) can be configured before the steps in FIGS. 4(a) to 4(f). The sorted flows are shown as FIGS. 5(a) to 5(i), and are the second embodiment according to the present invention.

FIGS. 6(a) to 6(i) are the exploded diagrams for the testing steps of the third embodiment according to the present invention, which are improved step procedures of the first embodiment in FIGS. 4(a) to 4(i). The third embodiment is to move the steps in FIGS. 4(e) and 4(f) to the end of the entire process (hereinafter referred to a modified diagonal type).

It should be noted that, the steps in FIGS. 6(e) to 6(i) are independent flows relative to the steps in FIGS. 6(a) to 6(d), so that the steps in FIGS. 6(e) to 6(i) are configured before the steps in FIGS. 6(a) to 6(d). The sorted flows are shown as FIGS. 7(a) to 7(i), and are the fourth embodiment according to the present invention.

FIGS. 8(a) to 8(i) are the exploded diagrams for the testing steps of the fifth embodiment according to the present invention, which uses the algorithm of the extended diagonal type (hereinafter referred to an extended diagonal type), so as to achieve 100% fault coverage.

FIGS. 9(a) to 9(h) are the exploded diagrams for the testing steps of the sixth embodiment according to the present invention, which improves the step procedure for the fifth embodiment in FIGS. 8(a) to 8(i). The sixth embodiment is to move the step of FIG. 8(f) as the last step in the testing flow, and omit the step of FIG. 8(e) (hereinafter referred to an extended and modified diagonal type).

Similar to the above cases, the steps in FIGS. 9(e) to 9(h) are independent flows relative to the steps in FIGS. 9(a) to 9(d), so that the steps from the FIGS. 9(e) to 9(h) are configured before the steps in FIGS. 9(a) to 9(d). The sorted flows are shown as FIGS. 10(a) to 10(h) for the seventh embodiment according to the present invention.

FIGS. 11(a) to 11(i) are exploded diagrams for the testing steps of the eighth embodiment according to the present invention, which improves the step procedures of the fifth embodiment in FIGS. 8(a) to 8(i). The eighth embodiment is to move the steps 8(g) to 8(i) to the start of the testing flow.

Table 1 illustrates the characteristics of test time and testing length comparing the present invention with the prior art through the RAMSES-FT fault detection simulator (referred to the paper by K. L. Cheng, J. C. Yeh, C. W. Wang, C. T. Huang, and C. W. Wu, "RAMSES-FT: A Fault Simulator for Flash Memory Testing and Diagnostics", Proc. IEEE VLSI Test Symp., Monterey, Calif., April 2002). Table 2 illustrates the comparison result for the fault coverage between the present invention and the prior art. The above-mentioned tests makes the example of the 2 MB (256K×8) flash memory, where the erasing time is 200 ms, the bit programming time is 12 μs, and the bit reading time is 10 ns. Furthermore, the above-mentioned test only uses the bit-oriented algorithm.

TABLE 1

| algorithm | Test Length | Complexity (N = m × n) | | | Test time (@100 MHz; unit: sec) |
| --- | --- | --- | --- | --- | --- |
| | | erase | program | read | |
| EF | $2e + (mn + 2m + n - 2)p + (2mn + m + n - 3)r$ | 2 | $1N + 3\sqrt{N}$ | $2N + 2\sqrt{N}$ | 3.569 |
| Flash March | $2e + (2mn)p + (4mn)r$ | 2 | $2N$ | $4N$ | 6.702 |
| March-FT | $2e + (2mn)p + (6mn)r$ | 2 | $2N$ | $6N$ | 6.707 |
| diagonal type | $2e + (mn + 2\max(m,n))p + (4mn + \max(m,n))r$ | 2 | $1N + 2\sqrt{N}$ | $4N + \sqrt{N}$ | 3.569 |
| modified diagonal type | $2e + (mn + 2\max(m,n))p + (4mn + 3\max(m,n))r$ | 2 | $1N + 2\sqrt{N}$ | $4N + 3\sqrt{N}$ | 3.569 |
| extended diagonal type | $2e + (2mn + \max(m,n))p + (5mn)r$ | 2 | $2N + \sqrt{N}$ | $5N$ | 6.711 |
| extended and modified diagonal type | $2e + (2mn)p + (5mn)r$ | 2 | $2N$ | $5N$ | 6.707 |

TABLE 2

| | WPD | WED | BPD | BED | OE | RD |
| --- | --- | --- | --- | --- | --- | --- |
| EF | 100% | 100% | 0% | 100% | 100% | 100% |
| Flash March | 100% | 100% | 100% | 100% | 100% | 100% |
| March-FT | 100% | 100% | 100% | 100% | 100% | 100% |
| diagonal type | 100% | 100% | 100% | 100% | 100% | 100% |
| modified diagonal type | 100% | 100% | 100% | 100% | 100% | 100% |
| extended diagonal type | 100% | 100% | 100% | 100% | 100% | 100% |
| extended and modified diagonal type | 100% | 100% | 100% | 100% | 100% | 100% |

| | SAF | TF | SOF | AF | CFst | Total fault coverage |
| --- | --- | --- | --- | --- | --- | --- |
| EF | 100% | 87.5% | 12.5% | 44.5% | 50% | 72.23% |
| Flash March | 100% | 100% | 50% | 100% | 75% | 93.18% |
| March-FT | 100% | 100% | 100% | 100% | 100% | 100% |
| diagonal type | 100% | 100% | 100% | 72.5% | 86.25% | 96.25% |
| modified diagonal type | 100% | 100% | 100% | 81.6% | 89.15% | 97.34% |
| extended diagonal type | 100% | 100% | 100% | 100% | 100% | 100% |
| extended and modified diagonal type | 100% | 100% | 100% | 100% | 100% | 100% |

In view of the results from Table 1 and Table 2, it has been proved that the testing length in the present invention is shorter, and is provided with better fault coverage for the disturb faults and common memory faults. Moreover, the testing method according to the present invention is provided with the regularity and symmetry, and makes the built-in self-test circuit built with the diagonal testing method according to the present invention easier to produce.

The above-described embodiments of the present invention are intended to be illustrative only. Numerous alternative embodiments may be devised by those skilled in the art without departing from the scope of the following claims.

What is claimed is:

1. A diagonal testing method for flash memories, comprising the steps of:
   (a) erasing a flash memory cell array;
   (b) programming cells of the flash memory cell array except in a first diagonal;
   (c) reading cells in the first diagonal of the flash memory cell array;
   (d) programming the cells in the first diagonal of the flash memory cell array; and
   (e) reading the cells of the flash memory cell array except in the first diagonal.

2. The diagonal testing method for flash memories of claim 1, further comprising the steps of:
   (f) programming cells in a second diagonal of the flash memory cell array; and
   (g) reading the cells in the first diagonal of the flash memory cell array.

3. The diagonal testing method for flash memories of claim 1, wherein the first diagonal is a −45° line from the upper left to the lower right of the flash memory cell array, and the second diagonal is a +45° line from the lower left to the upper right of the flash memory cell array.

4. The diagonal testing method for flash memories of claim 1, further comprising the following step after step (a):
   reading the cells of the flash memory cell array except in the first diagonal.

5. The diagonal testing method for flash memories of claim 1, further comprising the following step after step (b):
   reading the cells of the flash memory cell array except in the first diagonal.

6. The diagonal testing method for flash memories of claim 1, further comprising the following step after step (d):
   reading the cells in the first diagonal of the flash memory cell array.

7. The diagonal testing method for flash memories of claim 1, further comprising the steps of:
   (h) erasing the flash memory cell array;
   (i) programming the cells in the first diagonal of the flash memory cell array in a direction opposite to the first diagonal; and
   (j) reading the cells of the flash memory cell array except in the first diagonal.

8. The diagonal testing method for flash memories of claim 7, further comprising the following step after step (h):
   reading the cells in the first diagonal of the flash memory cell array in a direction opposite to the first diagonal.

9. The diagonal testing method for flash memories of claim 7, further comprising the following step after step (i):
   reading the cells in the first diagonal of the flash memory cell array in a direction opposite to the first diagonal.

10. The diagonal testing method for flash memories of claim 1, further comprising the steps of:
    (h) erasing the flash memory cell array;
    (i) programming the cells in the first diagonal of the flash memory cell array in a direction opposite to the first diagonal;
    (j) programming the cells except the first diagonal of the flash memory cell array in a direction from a higher address to a lower address; and
    (k) reading the cells except the first diagonal of the flash memory cell array in a direction from a higher address to a lower address.

11. The diagonal testing method for flash memories of claim 10, further comprising the step of:
    reading the cells in the first diagonal of the flash memory cell array.

12. The diagonal testing method for flash memories of claim 1, wherein the flash memory cell array is regarded as several squares and executed in a direction from top to bottom and from left to right.

13. A diagonal testing method for flash memories, comprising the steps of:
    erasing a flash memory cell array;
    programming cells in a first diagonal of the flash memory cell array in a direction opposite to the first diagonal;
    programming the cells except the first diagonal of the flash memory cell array in a direction from a higher address to a lower address; and
    reading the cells except the first diagonal of the flash memory cell array in a direction from a higher address to a lower address.

14. The diagonal testing method for flash memories of claim 13, further comprising the step of:
    reading the cells in the first diagonal of the flash memory cell array.

15. The diagonal testing method for flash memories of claim 13, further comprising the steps of:
    erasing the flash memory cell array;
    programming the cells of the flash memory cell array except in the first diagonal;
    reading the cells in the first diagonal of the flash memory cell array;
    programming the cells in the first diagonal of the flash memory cell array; and
    reading the cells of the flash memory cell array except in the first diagonal.

16. The diagonal testing method for flash memories of claim 13, further comprising the steps of:
    programming cells in a second diagonal of the flash memory cell array; and
    reading the cells in the first diagonal of the flash memory cell array.

17. The diagonal testing method for flash memories of claim 13, wherein the first diagonal is a −45° line from the upper left to the lower right of the flash memory cell array, and the second diagonal is a +45° line from the lower left to the upper right of the flash memory cell array.

18. A diagonal testing method for flash memories, comprising the steps of:
    erasing a flash memory cell array;
    programming cells in a first diagonal of the flash memory cell array in a direction opposite to the first diagonal; and
    reading the cells of the flash memory cell array except in the first diagonal.

19. The diagonal testing method for flash memories of claim 18, further comprising the steps of:
    erasing the flash memory cell array;
    programming cells of the flash memory cell array except in a first diagonal;
    reading the cells in the first diagonal of the flash memory cell array;
    programming the cells in the first diagonal of the flash memory cell array; and
    reading the cells of the flash memory cell array except in the first diagonal.

20. The diagonal testing method for flash memories of claim 18, further comprising the steps of:
    programming cells in a second diagonal of the flash memory cell array; and
    reading the cells in the first diagonal of the flash memory cell array.

* * * * *